United States Patent
Zhu

(10) Patent No.: US 12,048,219 B2
(45) Date of Patent: Jul. 23, 2024

(54) COLOR FILTER SUBSTRATE AND ORGANIC LIGHT-EMITTING DISPLAY PANEL

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Qiwen Zhu, Hubei (CN)

(73) Assignees: Wuhan China Star Optoelectronics Semiconductor Display Technology Co., Ltd., Wuhan (CN); Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/296,996

(22) PCT Filed: May 17, 2021

(86) PCT No.: PCT/CN2021/094178
§ 371 (c)(1),
(2) Date: May 26, 2021

(87) PCT Pub. No.: WO2022/236845
PCT Pub. Date: Nov. 17, 2022

(65) Prior Publication Data
US 2024/0016021 A1    Jan. 11, 2024

(30) Foreign Application Priority Data
May 8, 2021   (CN) .................... 202110499015.7

(51) Int. Cl.
H10K 59/38    (2023.01)
G02B 5/20     (2006.01)

(52) U.S. Cl.
CPC ............. *H10K 59/38* (2023.02); *G02B 5/201* (2013.01)

(58) Field of Classification Search
CPC ................................ H01K 59/38; G02B 5/201
See application file for complete search history.

(56) References Cited

U.S. PATENT DOCUMENTS

| | | | |
|---|---|---|---|
| 2011/0151605 A1* | 6/2011 | Yoon ................ | G02F 1/133514 216/19 |
| 2018/0145282 A1 | 5/2018 | Tokuda | |
| 2021/0193741 A1* | 6/2021 | Chen .................... | H10K 50/84 |

FOREIGN PATENT DOCUMENTS

| | | |
|---|---|---|
| CN | 106908985 | 6/2017 |
| CN | 108735790 | 11/2018 |

(Continued)

*Primary Examiner* — Christine A Enad

(57) ABSTRACT

A color filter substrate and an organic light-emitting display panel are disclosed. The color filter substrate is rectangular and has an upper side, a lower side, a left side, and a right side, wherein, the lower side corresponds to a driving chip of the organic light-emitting display panel. The color filter substrate includes a light-shielding layer defined with a plurality of light-transmitting holes arranged in an array, and from the upper side to the lower side, openings of the light-transmitting holes are gradually smaller. The present disclosure allows an aperture ratio of the light-shielding layer to be gradually reduced from the upper side that is away from the driving chip to the lower side that corresponds to the driving chip. Therefore, an area of the organic light-emitting display panel having uneven chroma and brightness can be compensated, thereby improving uniformity of the chroma and brightness.

18 Claims, 7 Drawing Sheets

(56) References Cited

FOREIGN PATENT DOCUMENTS

| CN | 109901323 | 6/2019 | | |
|----|-----------|--------|---|---|
| CN | 111129092 | 5/2020 | | |
| CN | 112054046 | 12/2020 | | |
| CN | 110187552 B | * 5/2022 | ......... | G02F 1/13306 |

* cited by examiner

COLOR FILTER SUBSTRATE AND ORGANIC LIGHT-EMITTING DISPLAY PANEL

RELATED APPLICATIONS

This application is a National Phase of PCT Patent Application No. PCT/CN2021/094178 having International filing date of May 17, 2021, which claims the benefit of priority of Chinese Patent Application No. 202110499015.7 filed on May 8, 2021. The contents of the above applications are all incorporated by reference as if fully set forth herein in their entirety.

FIELD AND BACKGROUND OF THE INVENTION

The present disclosure relates to the field of display technologies, and more particularly, to a color filter substrate and an organic light-emitting display panel.

With development of display technologies and changing of market demands, in recent years, flexible screens have become popular research objects and market trends. The flexible screens mainly refer to flexible organic light-emitting diodes (OLEDs), which have excellent bending properties due to being able to manufacture devices on plastic substrates and using plastic module materials rather than glass coverplates. However, since OLEDs use circular polarizers, thicknesses of panels are great and power consumption is high. Although polarizers (POLs) can effectively reduce reflectivity of the panels under strong light, nearly 58% of light extraction efficiency is lost, which greatly increases a burden of service life for OLEDs. In another aspect, the polarizers have a greater thickness and brittle material, which limit a bending radius of curvature, thereby being unbeneficial for development of flexible screen products. In order to develop the flexible screen products based on the OLEDs in current technology, it is necessary to introduce new materials, new techniques, and new processes to replace the polarizers.

Using color filters to replace the polarizers (POLs) is categorized as a POL-less technique, which can reduce the thicknesses of the panels, increase the light extraction efficiency, and reduce the power consumption at a same time. Color filters consist of red (R) color resists, green (G) color resists, blue (B) color resists, and a black matrix (BM). In OLED panels, the R/G/B color resists are responsible for light extraction of electroluminescent R/G/B sub-pixel units, respectively, and the black matrix is mainly responsible for preventing light leakage of the panels and reducing a reflective effect of the panels.

However, at present, IR drop of array substrates causes chroma and brightness of display panels to have differences. Meanwhile, thin film encapsulation (TFE) causes uneven colors between a center of an effective display area and a periphery of the effective display area, and a periphery of four corner regions in the display panels has a problem of pink color (that is, white pictures are slightly pink), thereby causing the display panels to have poorer uniformity of chroma and brightness.

Technical problem: an objective of the present disclosure is to provide a color filter substrate and an organic light-emitting display panel to solve following technical problems: the IR drop of the array substrates causes chroma and brightness of the display panels to have differences; meanwhile, thin film encapsulation (TFE) causes uneven colors between the center of the effective display area and the periphery of the effective display area, and the periphery of four corner regions in the display panels has the problem of pink color, thereby causing the display panels to have poorer uniformity of chroma and brightness.

SUMMARY OF THE INVENTION

In order to realize the above objective, an embodiment of the present disclosure provide a color filter substrate. The color filter substrate is rectangular and has an upper side, a lower side, a left side, and a right side, wherein, the lower side corresponds to a driving chip of an organic light-emitting display panel; wherein, the color filter substrate is defined with a peripheral region and a middle region, the peripheral region surrounds the middle region and is divided into an upper-side region, a lower-side region, a left-side region, and a right-side region corresponding to the upper side, the lower side, the left side, and the right side; the color filter substrate includes a light-shielding layer defined with a plurality of light-transmitting holes arranged in an array, the organic light-emitting display panel includes a plurality of pixel units, each of the pixel units includes at least two sub-pixels, and each of the light-transmitting holes is defined corresponding to one of the at least two sub-pixels; and the at least two sub-pixels include a first sub-pixel and a second sub-pixel, openings of the light-transmitting holes in the lower-side region, the left-side region, the right-side region, and the middle region are gradually smaller in a direction from the upper side to the lower side, and openings of the light-transmitting holes corresponding to the first sub-pixel in the upper-side region are smaller than the openings of the light-transmitting holes corresponding to the first sub-pixel that are closest to the upper-side region in the middle region.

In the color filter substrate of an embodiment of the present disclosure, in each row of the light-transmitting holes arranged in the array in the left-side region, the openings of the light-transmitting holes corresponding to the first sub-pixel are smaller than the openings of the light-transmitting holes corresponding to the first sub-pixel in a same row of the middle region.

In the color filter substrate of an embodiment of the present disclosure, in each row of the light-transmitting holes arranged in the array in the right-side region, the openings of the light-transmitting holes corresponding to the first sub-pixel are smaller than the openings of the light-transmitting holes corresponding to the first sub-pixel in the same row of the middle region.

In the color filter substrate of an embodiment of the present disclosure, in each row of the light-transmitting holes arranged in the array in the middle region, the openings of the light-transmitting holes corresponding to the first sub-pixel have a same size.

In the color filter substrate of an embodiment of the present disclosure, in the upper-side region, the lower-side region, the left-side region, the right-side region, and the middle region, the openings of the light-transmitting holes corresponding to the second sub-pixel are gradually smaller in the direction from the upper side to the lower side.

In the color filter substrate of an embodiment of the present disclosure, in each row of the light-transmitting holes arranged in the array in the upper-side region and the lower-side region, the openings of the light-transmitting holes corresponding to the first sub-pixel have a same size.

The color filter substrate of an embodiment of the present disclosure further includes a color resist layer, wherein, the color resist layer includes a plurality of red color resists, green color resists, and blue color resists, the red color resists, the green color resists, and the blue color resists are disposed in the light-transmitting holes, respectively, and the red color resists are disposed corresponding to the first sub-pixel.

In the color filter substrate of an embodiment of the present disclosure, the middle region is divided into a first region, a second region, and a third region in sequence from the upper side to the lower side; and in the second region, the openings of the light-transmitting holes corresponding to the first sub-pixel have a same size, and the openings of the light-transmitting holes corresponding to the second sub-pixel have the same size.

The present disclosure further provides an organic light-emitting display panel, which includes the color filter substrate mentioned above, a light-emitting functional layer, and the driving chip; wherein, the light-emitting functional layer is disposed under the color filter substrate and includes the pixel units, the first sub-pixel of each of the pixel units is a red sub-pixel, the second sub-pixel is a green sub-pixel, and each of the pixel units further includes a blue sub-pixel; and the driving chip is electrically connected to the light-emitting functional layer to drive the light-emitting functional layer to emit light.

The organic light-emitting display panel of an embodiment of the present disclosure further includes a thin film encapsulation layer disposed between the light-emitting functional layer and the color filter substrate.

Beneficial effect: the beneficial effect of the present disclosure is that the color filter substrate and the organic light-emitting display panel allow an aperture ratio of the light-shielding layer to be gradually reduced from the upper side that is away from the driving chip to the lower side that corresponds to the driving chip by setting different aperture ratios on different positions of the light-shielding layer of the color filter substrate. Therefore, an area of the organic light-emitting display panel having uneven chroma and brightness can be compensated, thereby improving uniformity of the chroma and brightness.

Figure 1:
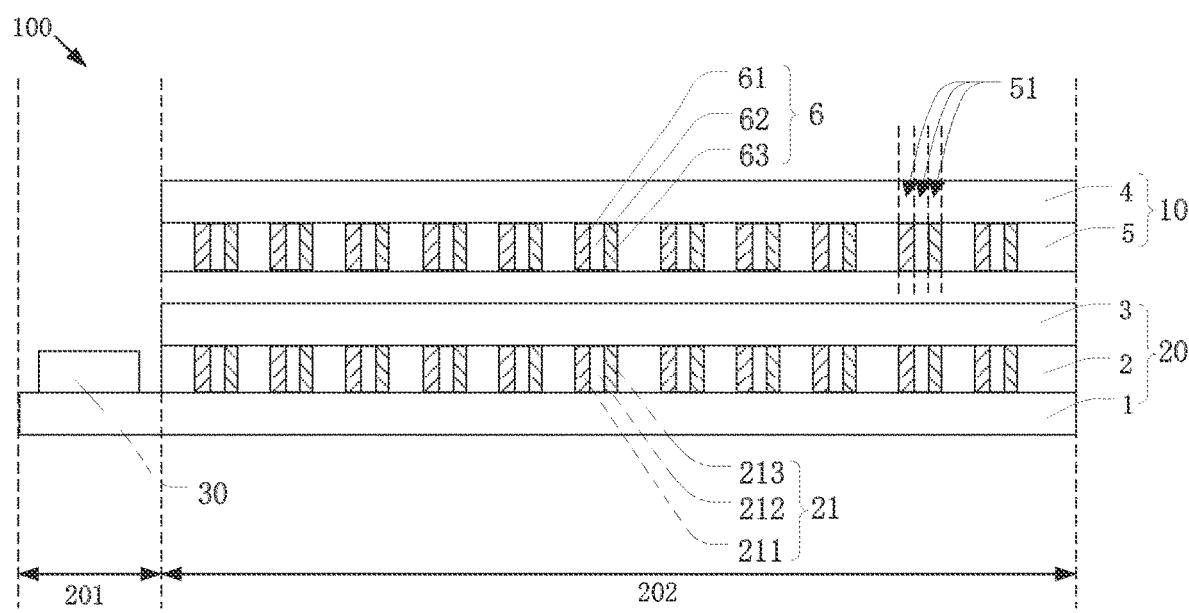
FIG. 1 is a schematic planar structural diagram of an array substrate bonded with a driving chip according to an embodiment of the present disclosure.

Elements in the drawings are designated by reference numerals listed below.
1. driving circuit layer; 2. light-emitting functional layer; 3. thin film encapsulation layer;
4. glass substrate; 5. light-shielding layer; 6. color resist layer;
10. color filter substrate; 11. upper side; 12. lower side; 13. left side; 14. right side; 20. array substrate;
21. pixel unit; 30. driving chip; 51. light-transmitting hole;
61. red color resist; 62. green color resist; 63. blue color resist;
100. organic light-emitting display panel; 110. peripheral region; 120. middle region;
111. upper-side region; 112. lower-side region; 113. left-side region;
114. right-side region; 115. corner regions; 121. first region;
122. second region; 123. third region; 201. bonding area; 202. display area; 211. first sub-pixel; 212. second sub-pixel; and
213. third sub-pixel 213.

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

Figure 2:
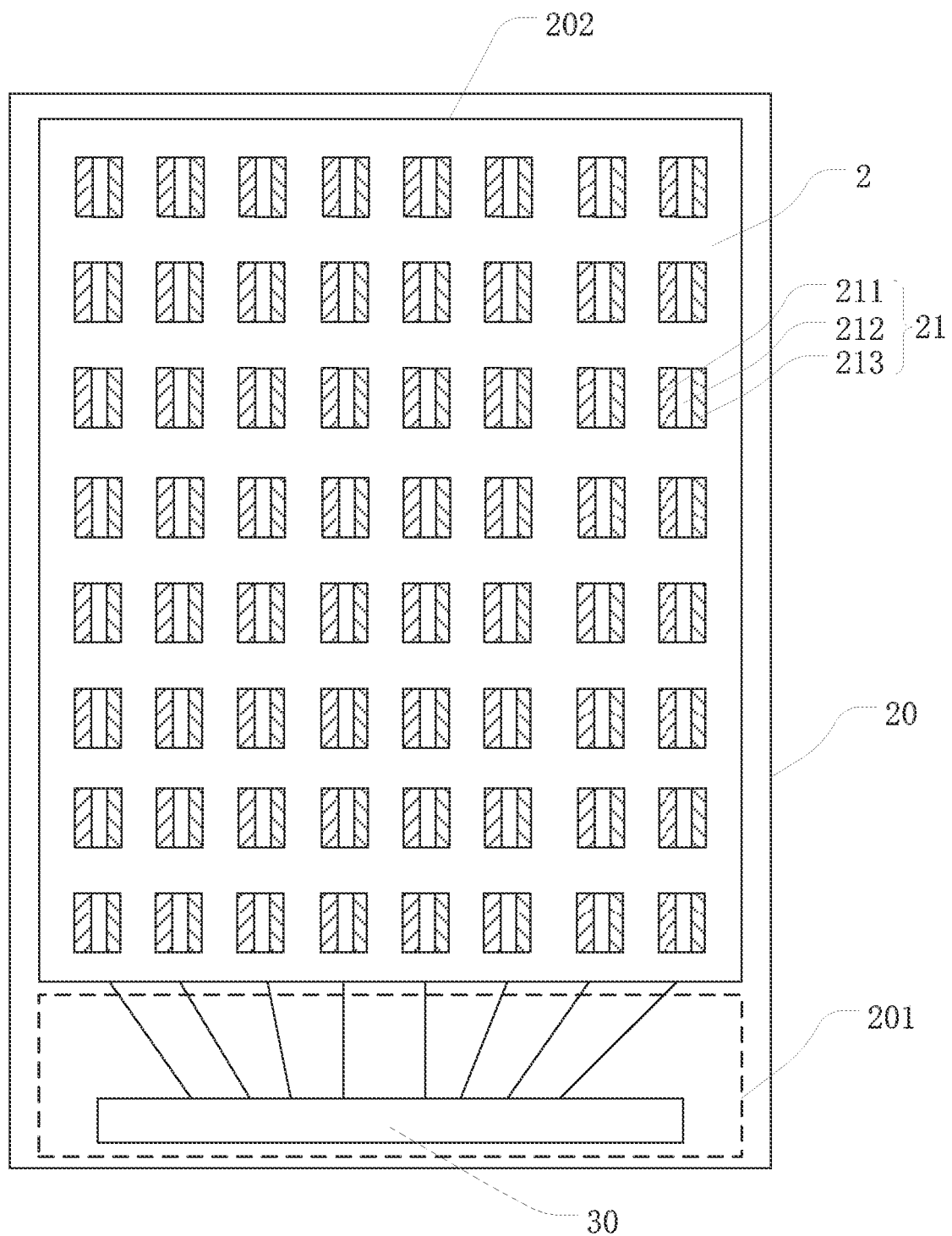
FIG. 2 is a schematic cross-sectional structural diagram of an organic light-emitting display panel according to an embodiment of the present disclosure.
Figure 3:
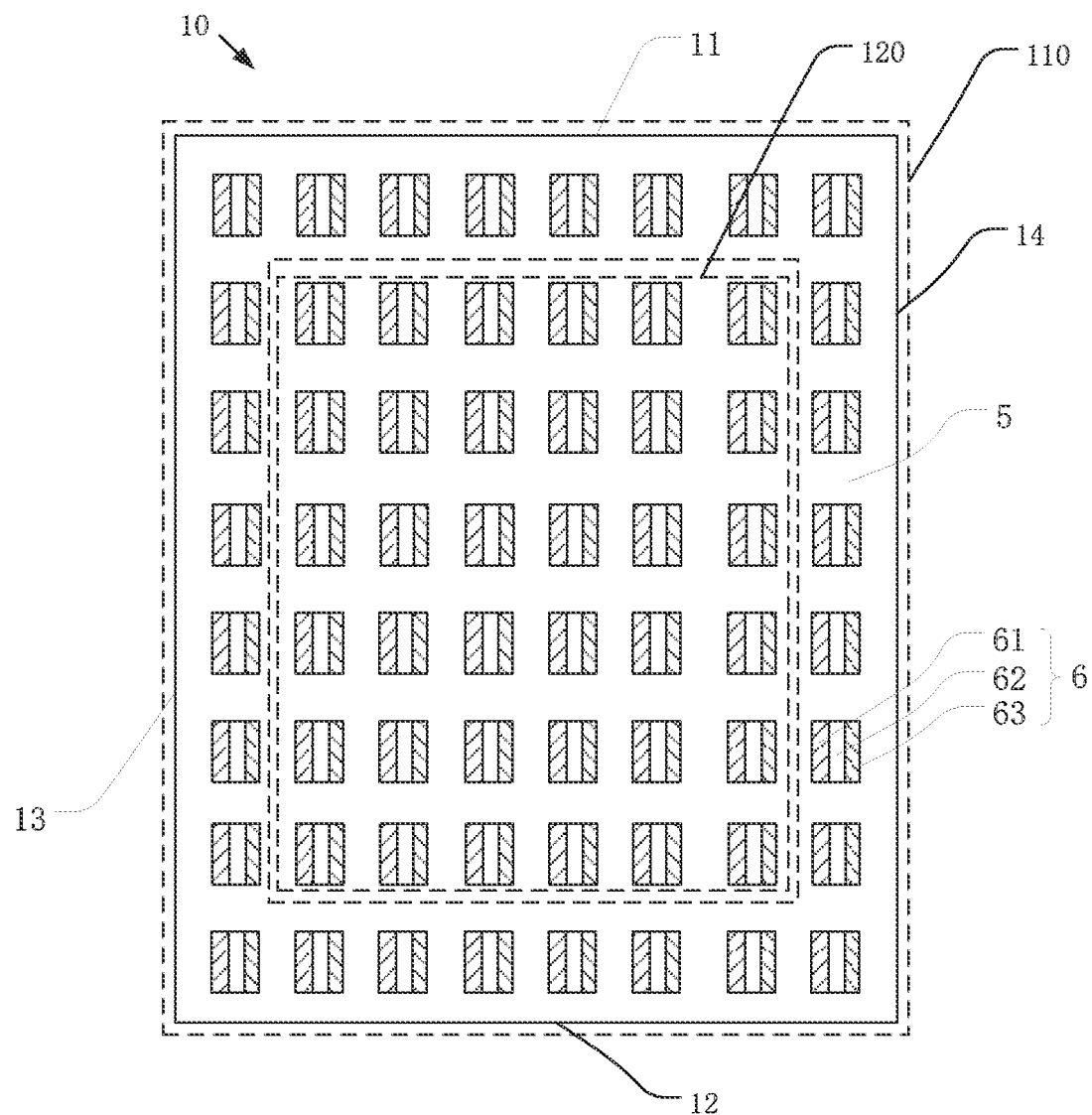
FIG. 3 is a schematic planar structural diagram of a color filter substrate according to an embodiment of the present disclosure.

Specifically, referring to FIGS. 1, 2, and 3, an embodiment of the present disclosure provides an organic light-emitting display panel 100, which includes a color filter substrate 10, an array substrate 20, and a driving chip 30. As shown in FIG. 1, the array substrate 20 is defined with a bonding area 201 and a display area 202, and the driving chip 30 is bonded in the bonding area 201. As shown in FIG. 1, the array substrate 20 includes a driving circuit layer 1, a light-emitting functional layer 2, and a thin film encapsulation layer 3 stacked in sequence from bottom to top. Specifically, the light-emitting functional layer 2 is disposed on the driving circuit layer 1, the thin film encapsulation layer 3 is disposed on the light-emitting functional layer 2 to play a role in isolating water and oxygen, and the driving chip 30 is electrically connected to the light-emitting functional layer 2 by the driving circuit layer 1 to drive the light-emitting functional layer 2 to emit light. The color filter substrate 10 is disposed on the array substrate 20, that is, the thin film encapsulation layer 3 is disposed between the light-emitting functional layer 2 and the color filter substrate 10.

As shown in FIGS. 1 and 2, the light-emitting functional layer 2 is disposed in the display area 202 of the array substrate 20, and the light-emitting functional layer 2 includes a plurality of pixel units 21. Each of the pixel units 21 includes at least two sub-pixels, and preferably includes a first sub-pixel 211, a second sub-pixel 212, and a third sub-pixel 213. The first sub-pixel 211 is a red sub-pixel, the second sub-pixel 212 is a green sub-pixel, and the third sub-pixel 213 is blue sub-pixel.

As shown in FIG. 3, in an embodiment of the present disclosure, a color resist layer 6 includes a plurality of red color resists 61, green color resists 62, and blue color resists 63. The red color resists 61, the green color resists 62, and the blue color resists 63 are all disposed in light-transmitting holes 51, respectively, and the red color resists 61 are disposed corresponding to first sub-pixels 211. Correspondingly, the green color resists 62 are disposed corresponding to second sub-pixels 212. It can be understood that the at least two sub-pixels of this embodiment further include the third sub-pixel 213, and the blue color resists 63 are disposed corresponding to third sub-pixels 213.

As shown in FIG. 1, the color filter substrate 10 is provided with a glass substrate 4, and a light-shielding layer 5 and the color resist layer 6 disposed on a same side as the glass substrate 4. The light-shielding layer 5 is defined with a plurality of light-transmitting holes 51 arranged in an array, and each of the light-transmitting holes 51 is defined corresponding to one of sub-pixels. The color resist layer 6 is disposed in the light-transmitting holes 51, so the color resist layer 6 and the light-shielding layer 5 are disposed on a same layer. The light-shielding layer 5 is between each two of the light-transmitting holes 51, that is, each two of the sub-pixels are isolated by the light-shielding layer 5.

Figure 4:
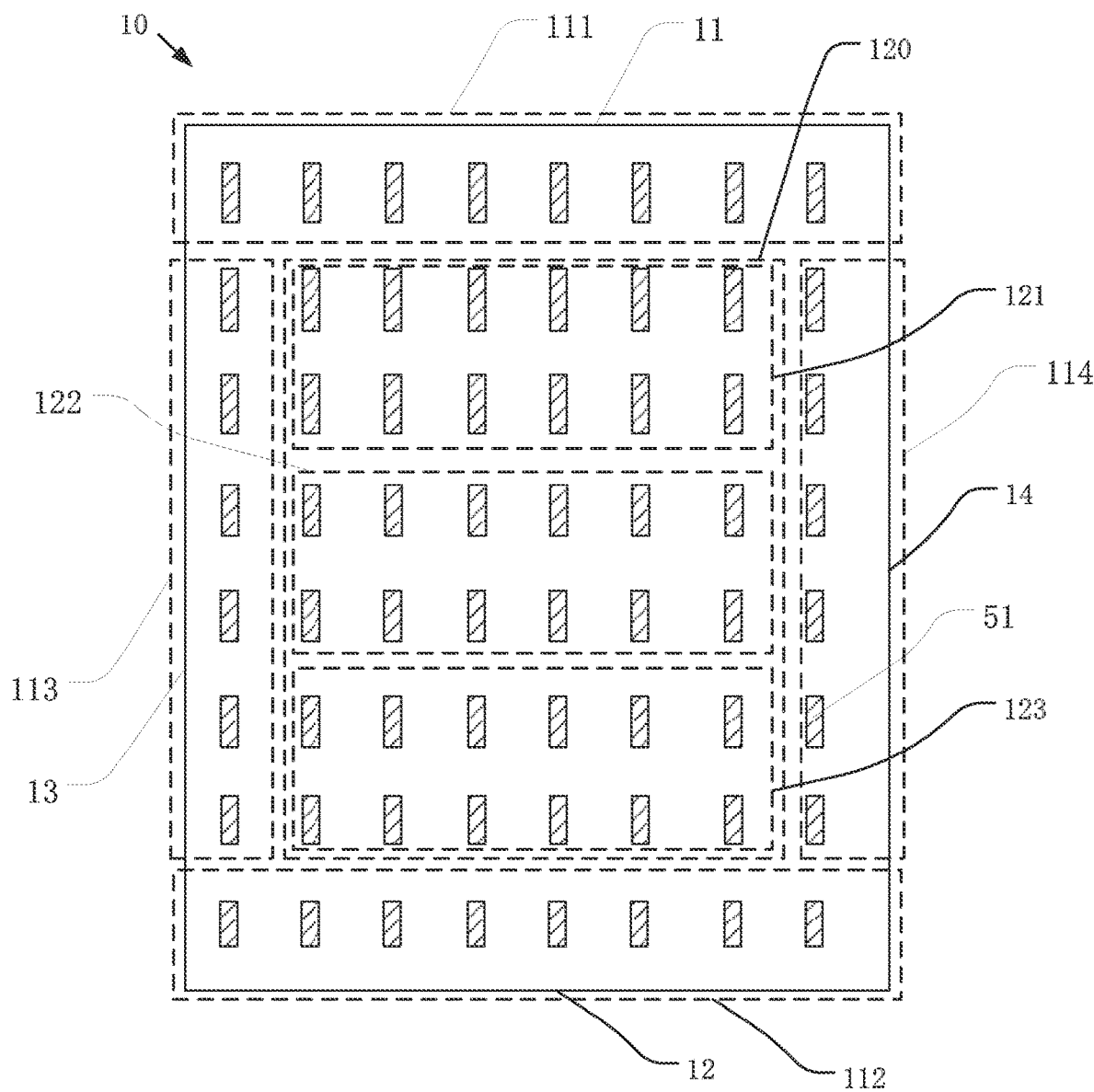
FIG. 4 is a schematic planar structural diagram of light-transmitting holes on the color filter substrate corresponding to first sub-pixels according to an embodiment of the present disclosure.

As shown in FIGS. 3 and 4, the color filter substrate 10 is rectangular and has an upper side 11, a lower side 12, a left side 13, and a right side 14, and the lower side 12 corresponds to the driving chip 30 of the organic light-emitting display panel. The color filter substrate 10 is defined with a peripheral region 110 and a middle region 120, the peripheral region 110 surrounds the middle region 120 and is divided into an upper-side region 111, a lower-side region 112, a left-side region 113, and a right-side region 114 corresponding to the upper side 11, the lower side 12, the left side 13, and the right side 14. The at least two sub-pixels of an embodiment of the present disclosure are the first sub-pixel 211 and the second sub-pixel 212. Openings of the light-transmitting holes 51 in the lower-side region 112, the left-side region 113, the right-side region 114, and the middle region 120 are gradually smaller in a direction from the upper side 11 to the lower side 12, and openings of the light-transmitting holes 51 corresponding to the first sub-pixels 211 in the upper-side region 111 are smaller than the openings of the light-transmitting holes 51 corresponding to the first sub-pixels 211 that are closest to the upper-side region 111 in the middle region 120.

Figure 5A:
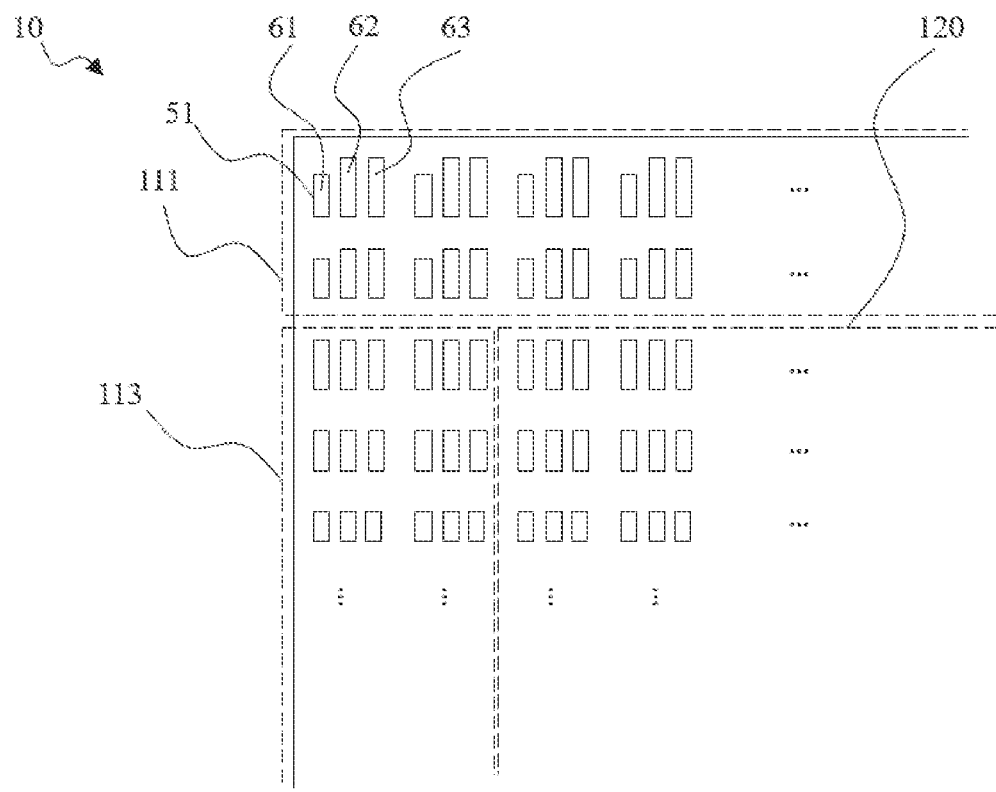
FIG. 5a is a schematic partial planar structural diagram of the color filter substrate according to an embodiment of the present disclosure.

Specifically, the organic light-emitting display panel 100 corresponding to the upper-side region 111 is prone to having a problem of pink color (that is, white pictures are slightly pink). The first sub-pixels 211 are red sub-pixels. As shown in FIG. 5a, the openings of the light-transmitting holes 51 corresponding to the red sub-pixels 211 (that is, the light-transmitting holes provided with the red color resists 61) in the upper-side region 111 of the color filter substrate 10 are smaller to reduce a luminous flux of red light, thereby relieving the problem of pink color in the upper-side region 111 and improving uniformity of chroma and brightness.

Specifically, the pixel units 21 that are closer to the upper side 11 have lower brightness due to IR drop of the pixel units 21 on the array substrate 20. The pixel units 21 that are closer to the lower side 12 have higher brightness, so the openings of the light-transmitting holes 51 in the lower-side region 112, the left-side region 113, the right-side region 114, and the middle region 120 of the color filter substrate 10 are set to be gradually smaller in the direction from the upper side 11 to the lower side 12, thereby relieving brightness differences caused by the IR drop.

The embodiment of the present disclosure gradually changes the openings of the light-transmitting holes 51 on different positions of the light-shielding layer 5 of the color filter substrate 10 to have different aperture ratios on the different positions of the color filter substrate 10. Therefore, the present disclosure allows an aperture ratio of the light-shielding layer 5 to be gradually reduced from the upper side 11 that is away from the driving chip 30 to the lower side 12 that corresponds to the driving chip 30, so an area of the organic light-emitting display panel having uneven chroma and brightness can be compensated, thereby improving the uniformity of the chroma and brightness. The present disclosure can solve a technical problem of the IR drop of the array substrate 20 causing panels to have differences in chroma and brightness.

Figure 5B:
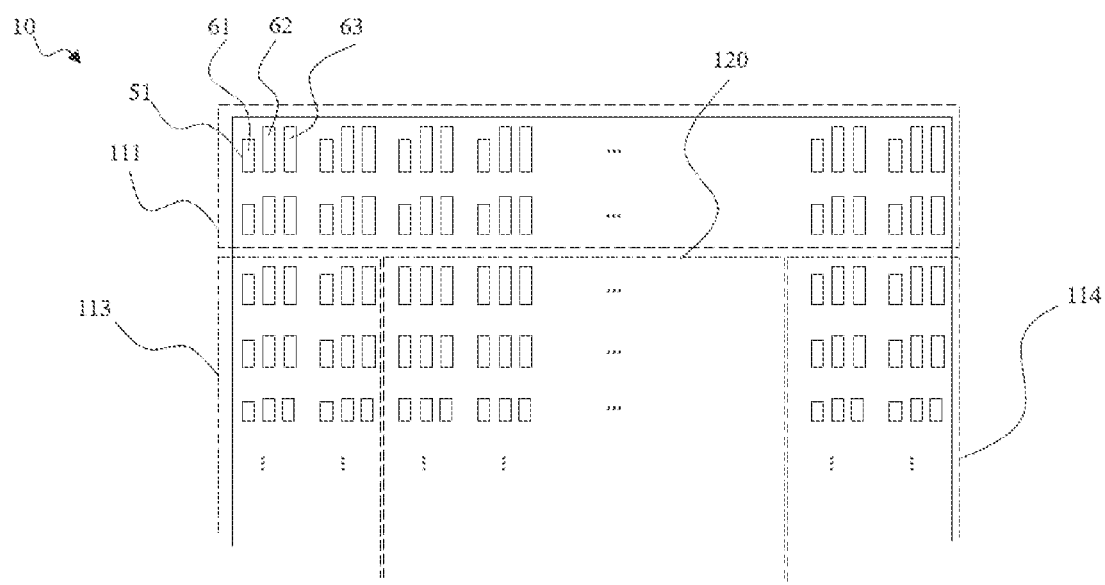
FIG. 5b is a schematic partial planar structural diagram of the color filter substrate according to another embodiment of the present disclosure.

Specifically, in an embodiment of the present disclosure, as shown in FIG. 5b, the organic light-emitting display panel 100 corresponding to the left-side region 113 and the right-side region 114 is prone to having the problem of pink color (that is, the white pictures are slightly pink). In each row of the light-transmitting holes 51 arranged in the array in the left-side region 113 of the color filter substrate 10, the openings of the light-transmitting holes 51 corresponding to the first sub-pixels 211 (that is corresponding to the red color resists 61) are set to be smaller than the openings of the light-transmitting holes 51 corresponding to the first sub-pixels 211 (that is corresponding to the red color resists 61) in a same row of the middle region 120. Correspondingly, in each row of the light-transmitting holes 51 arranged in the array in the right-side region 114, the openings of the light-transmitting holes 51 corresponding to the first sub-pixels 211 (that is corresponding to the red color resists 61) are set to be smaller than the openings of the light-transmitting holes 51 corresponding to the first sub-pixels 211 (that is corresponding to the red color resists 61) in the same row of the middle region 120. The first sub-pixels 211 are the red sub-pixels. The openings of the light-transmitting holes 51 corresponding to the red sub-pixels in the left-side region 113 and the right-side region 114 are smaller relative to the openings of the light-transmitting holes 51 corresponding to the red sub-pixels in the same row of the middle region 120 to reduce the luminous flux of the red light, thereby relieving the problem of pink color in the left-side region 113 and the right-side region 114 relative to the middle region 120, thereby improving the uniformity of chroma and brightness.

Specifically, the pixel units 21 that are closer to the left side 13 and the right side 14 have higher brightness due to the IR drop of the pixel units 21 on the array substrate 20. The pixel units 21 that are closer to the middle region 120 have lower brightness, so the openings of the light-transmitting holes 51 corresponding to the red sub-pixels (the red color resists 61) in the same row of the left-side region 113, the right-side region 114, and the middle region 120 are set to get larger in directions from the left side 13 to the middle region 120 and from the right side 14 to the middle region 120, thereby relieving the brightness differences caused by the IR drop.

As shown in FIGS. 5a and 5b, since the brightness differences of the pixel units 21 on the array substrate 20 corresponding to the middle region 120 caused by the IR drop are not large and IR drop differences of the pixel units 21 corresponding to a horizontal direction from the left side 13 to the right side 14 are not large, either, the openings of the light-transmitting holes 51 corresponding to the red sub-pixels in the same row in the middle region 120 of the color filter substrate 10 may be set to be same. Specifically, in an embodiment of the present disclosure, in each row of the light-transmitting holes 51 arranged in the array in the middle region 120, the openings of the light-transmitting holes 51 corresponding to the first sub-pixels 211 have a same size. In other embodiments, in order to adjust slight IR drop differences, the middle region 120 may be divided into mirror-symmetric left and right regions by a longitudinal symmetry axis of the middle region 120, and sizes of the openings of the light-transmitting holes 51 corresponding to the red sub-pixels in the same row are gradually increased in directions from the left-side region 113 to the longitudinal symmetry axis of the middle region 120 and from the right-side region 114 to the longitudinal symmetry axis of the middle region 120, thereby relieving the brightness differences caused by the IR drop.

Figure 5C:
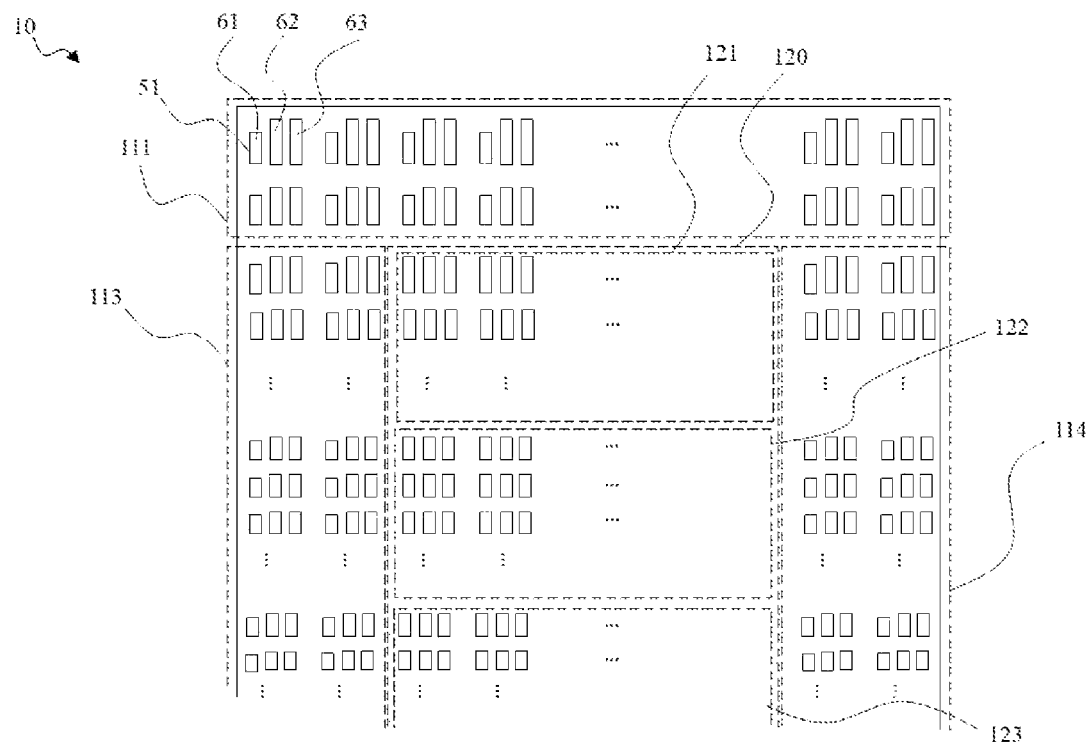
FIG. 5c is a schematic partial planar structural diagram of the color filter substrate according to yet another embodiment of the present disclosure.

As shown in FIG. 5c, in an embodiment of the present disclosure, the pixel units 21 that are closer to the upper side 11 have lower brightness due to the IR drop of the pixel units 21 on the array substrate 20. The pixel units 21 that are closer to the lower side 12 have higher brightness, so the openings of the light-transmitting holes 51 in the middle region 120 of the color filter substrate 10 are set to be gradually smaller in the direction from the upper side 11 to the lower side 12, thereby relieving the brightness differences caused by the IR drop. However, the IR drop differences of the pixel units 21 corresponding to a center position of the middle region 120 are not significant. Therefore, specifically, the middle region 120 of the color filter substrate 10 is divided into a first region 121, a second region 122, and a third region 123 in sequence from the upper side 11 to the lower side 12. Wherein, in the second region 122, the openings of the light-transmitting holes 51 corresponding to the first sub-pixels 211 (corresponding to the red color resists 61) have a same size, and the openings of the light-transmitting holes 51 corresponding to the second sub-pixels 212 (corresponding to the green color resists 62) have the same size. It can be understood that the openings of the light-transmitting holes 51 corresponding to the third sub-pixels 213 (corresponding to the blue color resists 63) may be set to have the same size. In addition, since the pixel units 21 corresponding to the first region 121 and the third region 123 have significant IR drop, the openings of the light-transmitting holes 51 corresponding to the first sub-pixels 211, the second sub-pixels 212, and the third sub-pixels 213 are gradually smaller in the direction from the upper side 11 to the lower side 12.

Figure 5D:
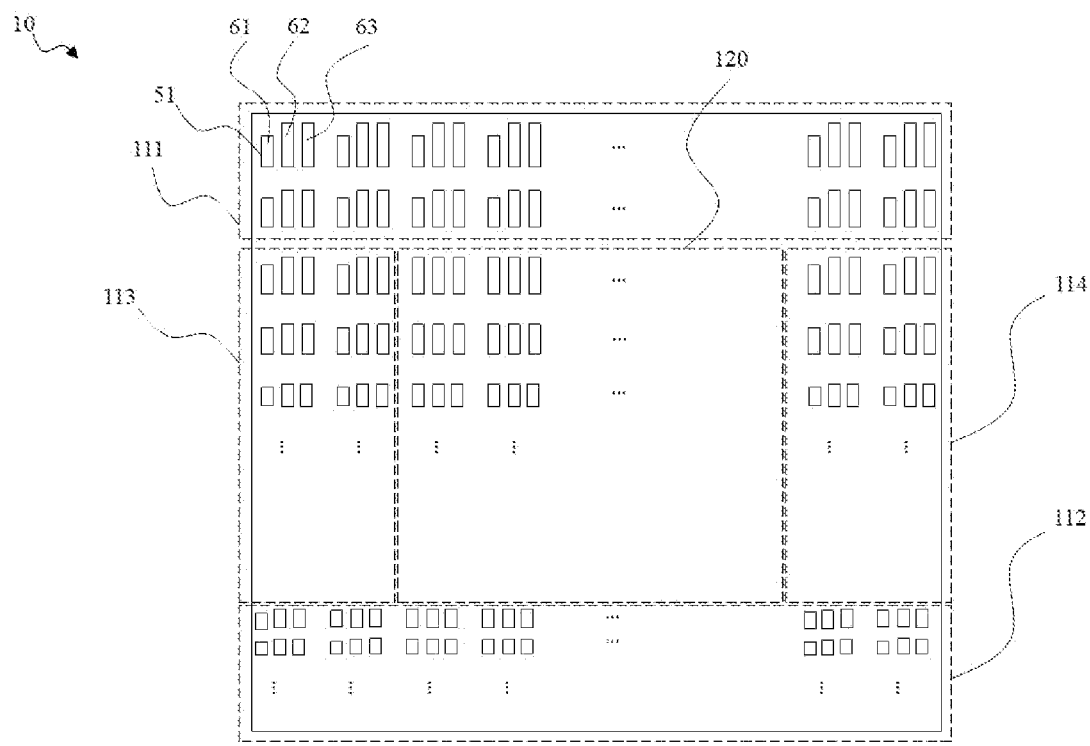
FIG. 5d is a schematic planar structural diagram of the color filter substrate according to another embodiment of the present disclosure.

Referring to FIG. 5d, in an embodiment of the present disclosure, in the upper-side region 111, the lower-side region 112, the left-side region 113, the right-side region 114, and the middle region 120, the openings of the light-transmitting holes 51 corresponding to the second sub-pixels 212 (that is, corresponding to the green color resists 62) are gradually smaller in the direction from the upper side 11 to the lower side 12.

Similarly, referring to FIG. 5d, in an embodiment of the present disclosure, in the upper-side region 111, the lower-side region 112, the left-side region 113, the right-side region 114, and the middle region 120, the openings of the light-transmitting holes 51 corresponding to the third sub-pixels 213 (that is, corresponding to the blue color resists 63) are gradually smaller in the direction from the upper side 11 to the lower side 12.

Figure 5E:
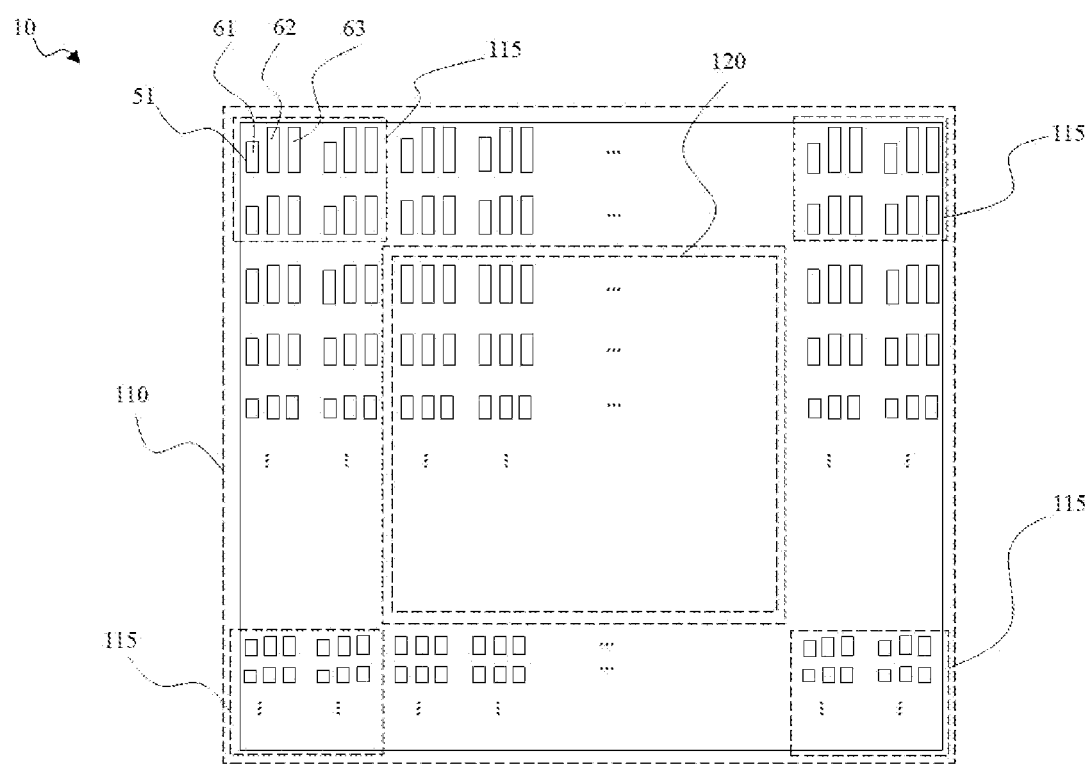
FIG. 5e is a schematic planar structural diagram of the color filter substrate according to yet another embodiment of the present disclosure.

As shown in FIG. 5e, the peripheral region 110 of the color filter substrate 10 has a rectangular frame structure. Wherein, the array substrate corresponding to four corner regions thereof causes uneven colors between the middle region 120 and the peripheral region 110 due to the thin film encapsulation layer 3 encapsulating the light-emitting functional layer 2, and the display panel correspond to the four corner regions 115 of the color filter substrate 10 also has the problem of pink color. Regarding this problem, the openings of the light-transmitting holes 51 corresponding to the first sub-pixels 211 (corresponding to the red color resists 61) in the corner regions 115 may be further made smaller. This method can relieve the problem of pink color in the four corner regions 115, thereby allowing the display panel to have better uniformity of chroma and brightness.

As shown in FIG. 5d, corresponding to the horizontal direction from the left side 13 to the right side 14, the IR drop differences of the pixel units 21 of the array substrate 20 are not significant. Therefore, in an embodiment of the present disclosure, in each row of the light-transmitting holes 51 arranged in the array in the upper-side region 111 and the lower-side region 112, the openings of the light-transmitting holes 51 corresponding to the first sub-pixels 211 (corresponding to the red color resists 61) have the same size.

In an embodiment of the present disclosure, in each row of the light-transmitting holes 51 arranged in the array in the upper-side region 111 and the lower-side region 112, the openings of the light-transmitting holes 51 corresponding to the second sub-pixels 212 (corresponding to the green color resists 62) have the same size, and the openings of the light-transmitting holes 51 corresponding to the third sub-pixels 213 (corresponding to the blue color resists 63) have the same size.

Since the light-transmitting holes 51 are arranged in the array on the light-shielding layer 5, the light-transmitting holes 51 are arranged at intervals, and distances of center points of any two adjacent light-transmitting holes 51 are same. A shape of the light-transmitting holes 51 is preferably one of rhombic, rectangular, circular, or triangular.

The beneficial effect of the present disclosure is that the color filter substrate and the organic light-emitting display panel allow the aperture ratio of the light-shielding layer to be gradually reduced from the upper side that is away from the driving chip to the lower side that corresponds to the driving chip by setting different aperture ratios on different positions of the light-shielding layer of the color filter substrate. Therefore, the area of the organic light-emitting display panel having uneven chroma and brightness can be compensated, thereby improving the uniformity of the chroma and brightness.

In the above embodiments, the description of each embodiment has its own emphasis. For a part that is not described in detail in an embodiment, refer to the related descriptions of other embodiments.

The color filter substrate and the organic light-emitting display panel provided by the embodiments of the present disclosure are described in detail above. Specific examples are used herein to explain the principles and implementation of the present disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A color filter substrate, disposed in an organic light-emitting display panel, having an upper side, a lower side, a left side, and a right side, wherein the lower side corresponds to a driving chip of the organic light-emitting display panel;
    wherein the color filter substrate is defined with a peripheral region and a middle region, the peripheral region surrounds the middle region and is divided into an upper-side region, a lower-side region, a left-side region, and a right-side region corresponding to the upper side, the lower side, the left side, and the right side;
    the color filter substrate comprises a light-shielding layer defined with a plurality of light-transmitting holes arranged in an array, the organic light-emitting display panel comprises a plurality of pixel units, each of the pixel units comprises at least two sub-pixels, and each of the light-transmitting holes is defined corresponding to one of the at least two sub-pixels; and
    the at least two sub-pixels comprise a first sub-pixel and a second sub-pixel, openings of the light-transmitting holes respectively corresponding to the first sub-pixel and the second sub-pixel in the lower-side region, the left-side region, the right-side region, and the middle region are gradually smaller in a direction from an edge of the upper side to an edge of the lower side, and openings of the light-transmitting holes corresponding to the first sub-pixel in the upper-side region are smaller than the openings of the light-transmitting holes corresponding to the first sub-pixel that are closest to the upper-side region in the middle region.

2. The color filter substrate according to claim 1, wherein in each row of the light-transmitting holes arranged in the array in the left-side region, the openings of the light-transmitting holes corresponding to the first sub-pixel are smaller than the openings of the light-transmitting holes corresponding to the first sub-pixel in a same row of the middle region.

3. The color filter substrate according to claim 2, wherein in each row of the light-transmitting holes arranged in the array in the right-side region, the openings of the light-transmitting holes corresponding to the first sub-pixel are smaller than the openings of the light-transmitting holes corresponding to the first sub-pixel in the same row of the middle region.

4. The color filter substrate according to claim 2, wherein in each row of the light-transmitting holes arranged in the array in the right-side region, the openings of the light-transmitting holes corresponding to the first sub-pixel are smaller than the openings of the light-transmitting holes corresponding to the first sub-pixel in the same row of the middle region.

5. The color filter substrate according to claim 1, wherein in each row of the light-transmitting holes arranged in the array in the middle region, the openings of the light-transmitting holes corresponding to the first sub-pixel have a same size.

6. The color filter substrate according to claim 1, wherein in each row of the light-transmitting holes arranged in the array in the upper-side region and the lower-side region, the openings of the light-transmitting holes corresponding to the first sub-pixel have a same size.

7. The color filter substrate according to claim 1, further comprising a color resist layer, wherein the color resist layer comprises a plurality of red color resists, green color resists, and blue color resists, the red color resists, the green color resists, and the blue color resists are disposed in the light-transmitting holes, respectively, and the red color resists are disposed corresponding to the first sub-pixel.

8. The color filter substrate according to claim 1, wherein the middle region is divided into a first region, a second region, and a third region in sequence from the upper side to the lower side; and
    in the second region, the openings of the light-transmitting holes corresponding to the first sub-pixel have a same size, and the openings of the light-transmitting holes corresponding to the second sub-pixel have the same size.

9. An organic light-emitting display panel, comprising:
    a color filter substrate having an upper side, a lower side, a left side, and a right side, wherein the lower side corresponds to a driving chip of the organic light-emitting display panel; and
    a light-emitting functional layer disposed under the color filter substrate and comprising a plurality of pixel units, each of the pixel units comprises at least two sub-pixels, the at least two sub-pixels comprise a first sub-pixel and a second sub-pixel, the first sub-pixel is a red sub-pixel, the second sub-pixel is a green sub-pixel, and the at least two sub-pixels further comprise a blue sub-pixel;
    wherein the color filter substrate is defined with a peripheral region and a middle region, the peripheral region surrounds the middle region and is divided into an upper-side region, a lower-side region, a left-side region, and a right-side region corresponding to the upper side, the lower side, the left side, and the right side;
    the color filter substrate comprises a light-shielding layer defined with a plurality of light-transmitting holes arranged in an array, and each of the light-transmitting holes is defined corresponding to one of the at least two sub-pixels; and
    openings of the light-transmitting holes respectively corresponding to the first sub-pixel and the second sub-pixel in the lower-side region, the left-side region, the right-side region, and the middle region are gradually smaller in a direction from an edge of the upper side to an edge of the lower side, and openings of the light-transmitting holes corresponding to the first sub-pixel in the upper-side region are smaller than the openings of the light-transmitting holes corresponding to the first sub-pixel that are closest to the upper-side region in the middle region.

10. The organic light-emitting display panel according to claim 9, wherein the driving chip is electrically connected to the light-emitting functional layer to drive the light-emitting functional layer to emit light.

11. The organic light-emitting display panel according to claim 9, wherein in each row of the light-transmitting holes arranged in the array in the left-side region, the openings of the light-transmitting holes corresponding to the first sub-pixel are smaller than the openings of the light-transmitting holes corresponding to the first sub-pixel in a same row of the middle region.

12. The organic light-emitting display panel according to claim 11, wherein in each row of the light-transmitting holes arranged in the array in the right-side region, the openings of the light-transmitting holes corresponding to the first sub-pixel are smaller than the openings of the light-transmitting holes corresponding to the first sub-pixel in the same row of the middle region.

13. The organic light-emitting display panel according to claim 11, wherein in each row of the light-transmitting holes arranged in the array in the right-side region, the openings of the light-transmitting holes corresponding to the first sub-pixel are smaller than the openings of the light-transmitting holes corresponding to the first sub-pixel in the same row of the middle region.

14. The organic light-emitting display panel according to claim 9, wherein in each row of the light-transmitting holes arranged in the array in the middle region, the openings of the light-transmitting holes corresponding to the first sub-pixel have a same size.

15. The organic light-emitting display panel according to claim 9, wherein in each row of the light-transmitting holes arranged in the array in the upper-side region and the lower-side region, the openings of the light-transmitting holes corresponding to the first sub-pixel have a same size.

16. The organic light-emitting display panel according to claim 9, wherein the color filter substrate further comprises a color resist layer, the color resist layer comprises a plurality of red color resists, green color resists, and blue color resists, the red color resists, the green color resists, and the blue color resists are disposed in the light-transmitting holes, respectively, and the red color resists are disposed corresponding to the first sub-pixel.

17. The organic light-emitting display panel according to claim 9, wherein the middle region is divided into a first region, a second region, and a third region in sequence from the upper side to the lower side; and in the second region, the openings of the light-transmitting holes corresponding to the first sub-pixel have a same size, and the openings of the light-transmitting holes corresponding to the second sub-pixel have the same size.

18. The organic light-emitting display panel according to claim 9, further comprising a thin film encapsulation layer disposed between the light-emitting functional layer and the color filter substrate.

* * * * *